(12) United States Patent
Palmer et al.

(10) Patent No.: US 7,924,966 B2
(45) Date of Patent: Apr. 12, 2011

(54) SYMMETRY CORRECTED HIGH FREQUENCY DIGITAL DIVIDER

(75) Inventors: Wyn Terence Palmer, Greensboro, NC (US); Kenny Gentile, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/558,890

(22) Filed: Sep. 14, 2009

(65) Prior Publication Data

US 2010/0128836 A1     May 27, 2010

Related U.S. Application Data

(60) Provisional application No. 61/193,380, filed on Nov. 21, 2008.

(51) Int. Cl.
    *H03K 21/00* (2006.01)
(52) U.S. Cl. ............................ 377/47; 377/48
(58) Field of Classification Search .................. 377/47, 377/48
See application file for complete search history.

(56) References Cited

U.S. PATENT DOCUMENTS

| | | | |
|---|---|---|---|
| 4,773,031 A * | 9/1988 | Tobin .......................... | 708/103 |
| 4,868,513 A | 9/1989 | Piercy et al. | |
| 5,038,117 A | 8/1991 | Miller | |
| 5,079,521 A | 1/1992 | Gaskell et al. | |
| 5,786,778 A | 7/1998 | Adams et al. | |
| 6,115,442 A * | 9/2000 | Lusinchi ......................... | 377/47 |
| 6,882,698 B2 * | 4/2005 | Mukaide .......................... | 377/48 |
| 7,058,010 B2 | 6/2006 | Chidambaran et al. | |
| 7,148,753 B1 | 12/2006 | Garlepp et al. | |
| 7,215,211 B2 * | 5/2007 | Lipan et al. ..................... | 331/34 |
| RE40,424 E | 7/2008 | Han et al. | |
| 7,457,388 B2 | 11/2008 | Van Den Berg | |
| 7,656,791 B1 | 2/2010 | Mok et al. | |
| 2002/0141344 A1 | 10/2002 | Chidambaran et al. | |
| 2003/0067405 A1 | 4/2003 | Keaveney et al. | |
| 2004/0036509 A1 | 2/2004 | Smith | |
| 2005/0046491 A1 | 3/2005 | Smith | |
| 2005/0149775 A1 | 7/2005 | Van Den Berg | |
| 2006/0139081 A1 | 6/2006 | Van Den Berg | |
| 2008/0143397 A1 | 6/2008 | Xia | |

(Continued)

FOREIGN PATENT DOCUMENTS

EP     1467488     10/2004

OTHER PUBLICATIONS

PCT International Search Report for PCT/US2009/064141 mailed on Jan. 25, 2010. PCT International Search Report for PCT/US2009/064178 mailed on Jan. 21, 2010.

*Primary Examiner* — Tuan Lam
(74) *Attorney, Agent, or Firm* — Kenyon & Kenyon LLP

(57) ABSTRACT

A clock frequency divider for odd numbered divide ratios. The divider clocks two counters in parallel from a reference clock to be divided. One counter is loaded with the divide ratio and the other counter is loaded with the divide ratio except for the least significant bit. The second counter will set a latch when its count has elapsed. The first counter will reset the latch when its count has elapsed and will reload the counters. The latch is used for the divided output, but passes through a retiming circuit. The retiming circuit delays the output edge by one reference clock edge when the least significant bit indicates an odd numbered divide ratio.

14 Claims, 5 Drawing Sheets

U.S. PATENT DOCUMENTS

| | | |
|---|---|---|
| 2008/0219399 A1* | 9/2008 | Nary .......................... 377/47 |
| 2008/0246521 A1 | 10/2008 | Feng |
| 2009/0174492 A1 | 7/2009 | Zhang |
| 2009/0195275 A1 | 8/2009 | Friedman et al. |
| 2009/0256601 A1 | 10/2009 | Zhang et al. |
| 2010/0091688 A1 | 4/2010 | Staszewski et al. |

* cited by examiner

US 7,924,966 B2

SYMMETRY CORRECTED HIGH FREQUENCY DIGITAL DIVIDER

REFERENCE TO RELATED APPLICATIONS

This application claims priority to U.S. Provisional Application No. 61/193,380, filed Nov. 21, 2008, the contents of which are incorporated herein by reference in its entirety.

BACKGROUND

Frequency dividers are products that dynamically divide the frequency of a clock signal into clock signals having lower frequencies. The frequency division occurs in response to a ratio that is determined by a control signal. It is preferable to provide a signal having a symmetrical duty cycle, e.g., a duty cycle of 50 percent. Known frequency division systems typically use a programmable counter to perform frequency division but, to achieve a 50% duty cycle, also include a divide-by-2 stage, to generate rising and falling edges of an output clock signal. This divide by 2 stage limits division ratios to multiples of two.

The inventors perceive a need to provide frequency dividers that have a wider range of frequency division ratios, including ratios that are not multiples of two.

DETAILED DESCRIPTION

Embodiments of the present invention provide a frequency divider that includes a pair of counters clocked in parallel with the signal to be frequency divided. A first counter is loaded with a digital count value M representing a desired frequency division ratio. A second counter may be loaded with a count value approximating half the value M. Specifically, the second count value may be derived from the value M but omits its least significant bit (e.g., B−1 bits of M if M is a B bit digital value). The counters may be clocked in parallel. Each counter will generate an output pulse after a number of clock cycles have elapsed that match the loaded count value. The second counter, therefore, may generate an output pulse at approximately half the period of the first counter. A timing circuit may add additional delay to the output pulse generated by the second counter, depending on the value of the LSB of M. In this manner, the system generates an output clock having any frequency division ratio that is desired and also generating a 50% duty cycle.

Figure 1:
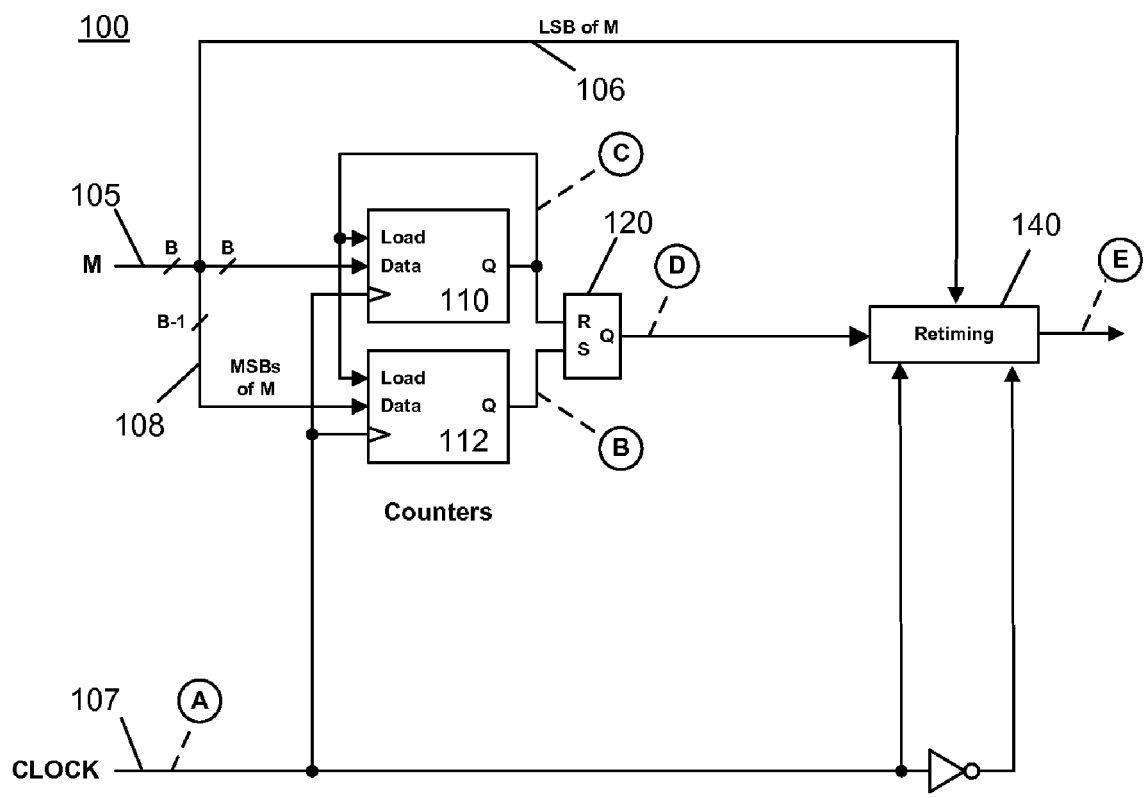
FIG. 1 illustrates an example frequency divider circuit, according to one example embodiment of the present invention.

FIG. 1 illustrates a frequency divider 100 according to an embodiment of the present invention. The frequency divider 100 may generate an output clock (line E) from an input clock signal (line A) according to a frequency division ratio M. The frequency divider 100 may include a pair of counters 110, 112, a latch 120 and a retiming circuit 140, all of which may be clocked by the input clock signal. A first counter 110 may be loaded with a data value M representing the frequency division ratio. A second counter 112 may be loaded with data value N representing M shifted by one position (N=M/2, rounded down). Each counter 110, 112 may generate an output to the latch 120 indicating when the respective count value has elapsed. Latch 120 may generate an output clock signal having a frequency of the input clock signal divided by M (line D). The duty cycle of the clock signal on line D may not be 50% when M is an odd number. The retiming unit 140 may add appropriate delay to a falling edge of the clock signal when M is odd, thereby correcting the duty cycle.

Figure 2:
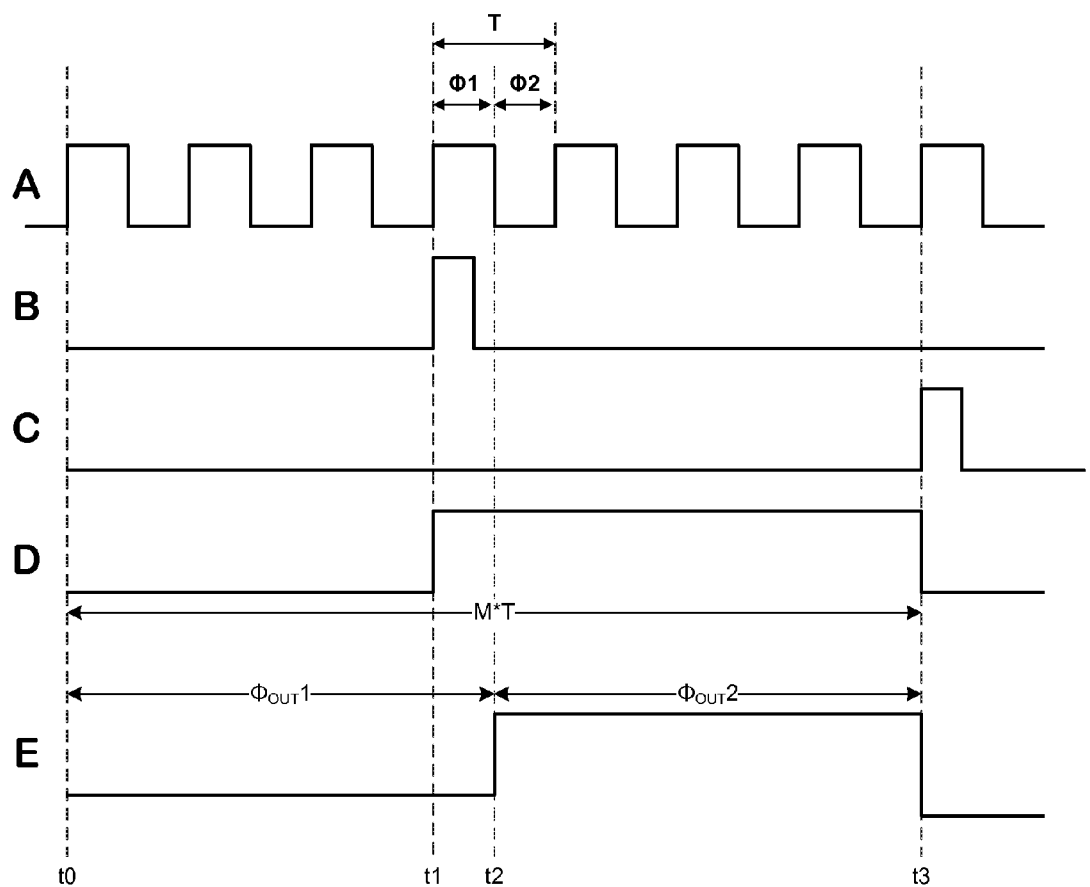
FIG. 2 illustrates an example state diagram for one example embodiment of the present invention.
Figure 4:
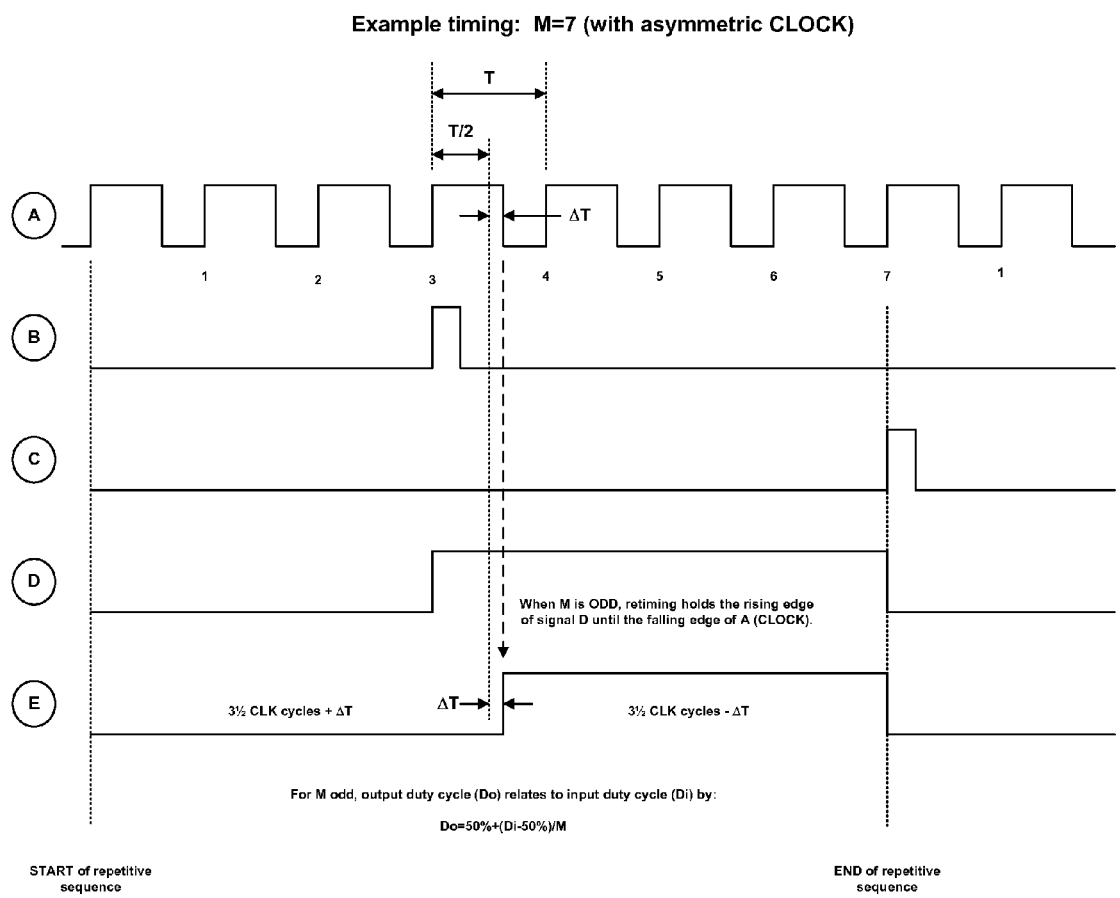
FIG. 4 illustrates another example state diagram for one example embodiment of the present invention.

FIG. 2 illustrates an example of operation of the frequency divider of FIG. 1 when M=7. Graph A may illustrate the input clock (e.g., clock signal 307 of FIG. 1). As illustrated, the input clock signal A may be symmetrical, e.g., it may have a duty cycle that is equal to 50%. The period of clock signal A is shown as T, having two phases $\phi1$, $\phi2$. Because the input clock signal in FIG. 2 may be symmetrical, the two phases may be equal. In other examples, e.g., as illustrated in FIG. 4, the input clock may be asymmetric. Graph B may correspond to an input of latch 120 from counter 112, which transitions high when counter 112 elapses. Graph C illustrates an input of latch 120 from counter 110, which transitions high when counter 110 elapses (every seventh clock cycle in the example of FIG. 2). Graphs D and E represent outputs from the latch 120 and retiming circuits 140 respectively.

Because M=7 ("0111" in binary) in the example of FIG. 2, the value loaded into counter 112 will be 3 ("011" in binary). Both counters 110, 112 may begin counting at time t0. The counter 112 may output a high pulse when its count value elapses, shown at time t1. The output of the counter 112 also may cause the latch's output to transition high. The output of latch 120 may be held high until counter 110 generates a high output (time t3), which resets the latch 120. Thus, the latch 120 may toggle high to low with a period of M*T, which divides the frequency of the clock signal by a factor of M.

In cases where M is an even number (not shown in FIG. 2), the duty cycle of the latch's output will be 50% and may be output from the frequency divider 100 directly. When M is odd, the duty cycle of the output from the latch 120 will not be 50%. It may be off by one half the period of the input clock signal (T/2). In an embodiment in which the input clock signal is symmetric, the retiming circuit may be implemented as a latch which delays the rising edge of the latch's output for an additional half-cycle until time t2. The retiming circuit need not delay the falling edge of the latch's output. Thus, graph E illustrates a 50% duty cycle clock in which both phases of the output clock $\phi_{OUT}1$, $\phi_{OUT}2$ have equal duration. In this example, phases $\phi_{OUT}1$, $\phi_{OUT}2$ of the output clock signal E each are 3.5 clock cycles of the input clock signal, which corresponds to the division ratio M=7.

In an embodiment, the output of counter 110 not only may activate the reset input of latch 120, it also may feed back into the load input of counters 110 and 112, resetting them. The result of this load signal will cause the counters to be reset with whatever value of M is currently on the input bus. If M is held constant, the frequency divider 100 may generate an output signal of constant frequency. However, the ratio value M may be changed in real-time, and the frequency divided output E may be adjusted to the new value of M, as soon as the current divided clock cycle E is finished.

The foregoing presentation of FIG. 1 discussed using two decrementing counters 110 and 112. The counter circuits 110 and 112 function with three inputs, e.g., load, data, and clock. Further, each counter may have an output Q indicating when the input count value (M, N respectively) have been consumed. Although a decrementing counter is illustrated in FIG. 1, incrementing counters may be used alternatively with appropriate indicators to signal when the count value has been consumed. When the single-bit load signal is high, the counters 110 and 112 may replace the current count with a value represented by M. M, signal 105, may include B single bit binary signals, which together represent a B-bit binary number. This B-bit binary number may then be decremented every clock signal 107. The decrementing counter may produce a high output value Q whenever the counter reaches zero, and low for count values greater than zero.

The clock input of each counter (110 and 112) may be connected to clock signal 107. The load signal of each counter may be connected to the output C of counter 110. The data input of counter 110 may be each bit of the multi-bit variable M. The data input of counter 112 may be a logical shift right of M. This may also be referred to the modulus of M divided by 2 in base 2, a truncation of M divided by 2 in base 2, or any number of other representations of dividing by 2 and rounding down. For example, a logical shift right of a four-bit number 0111 (e.g., 7 in base ten) would be 0011 (e.g., 3 in base ten), which is half of M, ignoring or rounding down any remainder. The LSB of M is also sent to the retiming circuit 140 for use in the final output E.

The counters 110 and 112 may both output to a latch 120, a flip flop, or any other state holding circuit of similar logical operation. A simple latch component, as is known in the art, may include a set input, a reset input, and an output. On the rising edge of the reset input, the latch may output a low signal, and continue to output a low signal until a rising edge of the set input. On the rising edge of the set input, the latch may output a high signal, and continue to output a high signal until a rising edge of the reset input. The first counter 110, which takes M as a data input, may be connected to the reset input of latch 120. The second counter 112, which takes M divided by 2, rounded down as a data input, may be connected to the set input of the latch 120. Retiming circuit 140 may then have as inputs the LSB of M, the output of latch 120, the clock signal, and the inverse of the clock signal. Retiming circuit 140 may operate and produce output E, as described with reference to the state diagram illustrated in FIG. 2, and discussed above. The retiming circuit may be a simple flip flop clocked by the input to the divider stage from the VCO, e.g., signal A.

Figure 3:
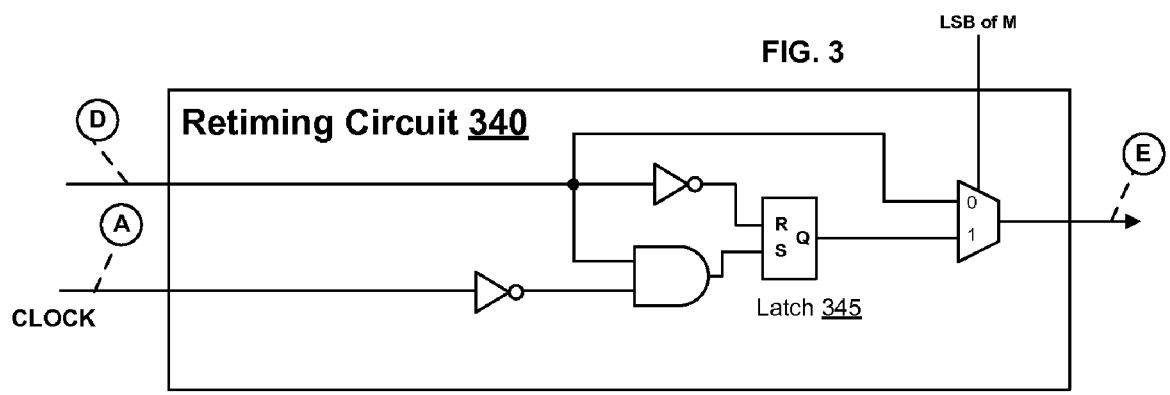
FIG. 3 illustrates one example retiming circuit, according to one example embodiment of the present invention.

FIG. 3 illustrates one example retiming circuit 140 according to an embodiment of the present invention. Any number of designs are possible for this circuit to provide the functionality described above (e.g., delaying a state-shift in the output a half clock cycle when the LSB of M indicates an odd number). When the divide ratio M is even, the final output E will match the output of latch 120 (e.g., D), and the LSB of M will be a zero. However, when the divide ratio M is odd, then the final output E needs to be delayed a half clock cycle. Also, an odd divide ratio will have a LSB of one. Thus, the example retiming circuit illustrated in FIG. 3 uses a single-select-line multiplexer to pass-through the output D as final output E, when the LSB is zero and M is even. When the LSB of M is a one the retiming circuit may delay the signal D by a half clock cycle. To do this, the retiming circuit 340 may use another latch 345 to set when D is high, and the clock is low (e.g., with the use of an AND gate). This way, latch 340 may be set on the falling edge of the clock cycle, delaying E until then. The set input may toggle on and off as the clock input rises and falls, but the latch will hold the high output until a reset signal is received. As soon as D is low, E also should be low regardless of the LSB value. Thus, the inverse of D is connected to the reset input of latch 345.

FIG. 4 illustrates an example of when the input clock is not symmetrical. In the case of an asymmetric clock, the second phase φ2 may occur at some time that is offset from the mid-point of T by ΔT (e.g., T/2 minus ΔT). The use of an asymmetric input clock, with the design illustrated in FIG. 1 for example, will produce an asymmetric output. The asymmetric output signal will be an approximation, where the higher the value of the divide ratio is, the closer the final output is to a symmetric output. Since the final output is delayed to the falling edge of the input clock, which is T/2 plus ΔT into the cycle, asymmetric delay in the final output will always be ΔT, regardless of how many input cycles occur in a single output cycle. Thus, the higher the divide ratio, the lower ΔT is in relation to the wavelength of the output signal. One example may be an input clock with a wavelength of 10 units and a 60% duty cycle. This input clock is 10% off of a symmetric cycle (e.g., a 50% duty cycle). If the divide ration is 9 for example, then the output signal will change states on the falling edge of the 5th cycle, or after 46 units of time, out of a total 90 unit wavelength. This represents a 48.9% duty cycle, which is much closer to a symmetric cycle as compared to the input.

Figure 5:
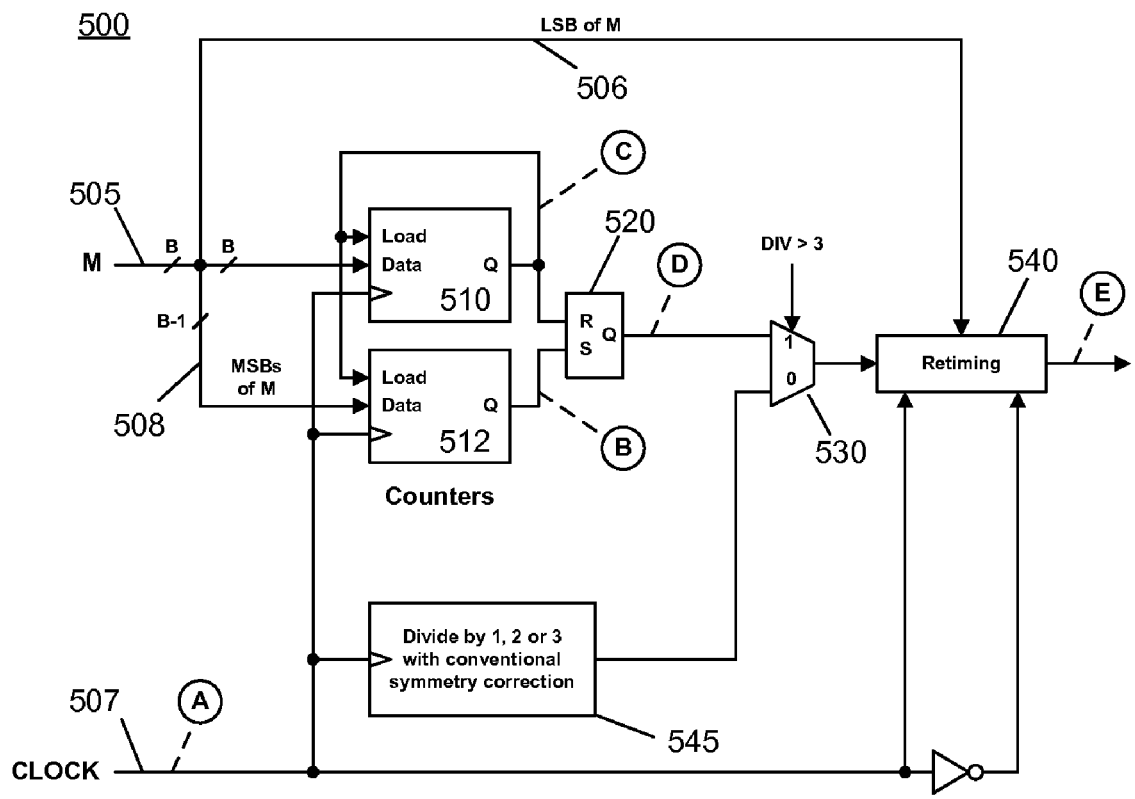
FIG. 5 illustrates another example frequency divider circuit, according to another example embodiment of the present invention.

Since lower divide ratios with asymmetric input clocks may produce an unacceptably asymmetric output, an alternative embodiment may be implemented. FIG. 5 illustrates one such alternative embodiment of the present invention. The frequency divider 500 may include a pair of counters 510, 512, a latch 520 and a retiming circuit 540, all of which may be clocked by the input clock signal. The frequency divider 500 further may include a supplementary divider circuit 545 and multiplexer 530. The first and second counters 510, 512 may be loaded with the frequency division ratio M and a logical right shifted value N respectively and may generate outputs to the latch 520 that generate a frequency divided clock signal.

The supplementary divider 545 may generate a frequency divided clock signal according to predetermined ratios (e.g., divide by one, two or three). The second input of the multiplexer 330 may receive the output of a supplementary divider 545. The multiplexer 530 selects based on the value of M, such that divide ratios greater than 3 use the latch output and divide ratios less than or equal to 3 use the conventional divider 545 output. Different example embodiments may use different values of M for the select line of multiplexer 530, and a value of 3 is only one example. This alternative embodiment may eliminate the need for at least one divide-by-two stages. Also, this alternative embodiment may increase the accuracy of divided output E when the divide ratio is smaller. For example, as discussed with respect to FIG. 4.

Several embodiments of the present invention are specifically illustrated and described herein. However, it will be appreciated that modifications and variations of the present invention are covered by the above teachings and within the purview of the appended claims without departing from the spirit and intended scope of the invention. Some variations include what types of counters or other circuits are used. For example, the counters discussed above have been described in the context of down counters that are loaded with respective count values M or X and are decremented until the respective count values reach zero. This is just one implementation, and in other implementations a counter may count up from zero to the respective count value and generate an output pulse when the incremented count value matches the loaded count value. In yet another implementation, counters may be loaded with a count value that includes a predetermined offset (say loading a count value M'=M+offset, where M represents the frequency division ratio sought during operation). They may count down from the loaded count value and generate an output pulse when the decremented count value reaches the offset value, rather than zero. Alternatively, they may count up from the offset value and generate an output pulse when the incremented value reaches the loaded count value. Other circuit components are likewise interchangeable, as known in the art, when accomplishing a similar logical function.

We claim:

1. A frequency divider to divide an input clock frequency by a variable divide ratio M, comprising:
    a pair of counters, first counter to load the divide ratio M and the second counter to load the divide ratio M except its least significant bit, the counters having clock inputs coupled to a common source, each counter having an output to indicate when its respective count value elapses,
    a latch having inputs coupled to the outputs of the counters and having an output for an output clock signal,
    a timing circuit, having a control input coupled to the least significant bit of the divide ratio M, to delay propagation of one edge of the output clock signal when the control input is enabled.

2. The frequency divider of claim 1, wherein M varies during operation of the frequency divider.

3. The frequency divider of claim 1, where an output of the first counter causes the first and second counters to re-load a new divide ratio.

4. A method for dividing an input clock frequency by a variable divide ratio M, comprising:
    loading the divide ratio M into a first counter circuit;
    loading the divide ratio M except its least significant bit into a second counter circuit, wherein each counter has a clock input, and each counter has an output to indicate when its respective count value elapses;
    clocking the counters in parallel from a common clock source;
    setting a latch output when the second counter count value elapses;
    resetting the latch output when the first counter count value elapses;
    producing a divided output clock as a function of the latch output; and
    delaying an edge of the divided output clock as a function of the least significant bit of M.

5. The method of claim 4, further comprising:
    reloading both counters when the first counter count value elapses.

6. The method of claim 4, wherein the value of M changes during operation of the method.

7. The method of claim 4, wherein the delaying includes changing states for the divided output clock at the next edge of the common clock source after the second counter count value elapses.

8. A frequency dividing device, comprising:
    a first counter configured to produce a first output as a function of inputs, including: a clock input, a divide number M input, and the first output looped back as an input;
    a second counter configured to produce a second output as a function of inputs, including: the clock input, the first output, and a number N set as a function of a truncation of M divided by two;
    a set-reset latch with a Q output configured to reset upon the first output and to set upon the second output;
    a divided output module with inputs including the Q output, the clock input, and an indication of whether M is odd or even;
    the divided output module having a two-state output configured to change states at a rising or falling edge of the N+1 clock cycle as a function of M being an odd or even number.

9. The device of claim 8, wherein the first counter is configured to:
    reset to a current value of M as a function of the first output;
    progress a stored count as a function of the clock input; and
    produce the first output when the stored count is fully elapsed.

10. The device of claim 8, wherein the function of whether M is odd or even is a function of the least significant bit of M.

11. The device of claim 8, wherein a high value for the least significant bit indicates an odd value for M and a low value for the least significant bit indicates an even value for M.

12. The device of claim 8, wherein the two-state signal includes a high state and a low state.

13. The device of claim 12, wherein changing states on the rising or falling edge of the N+1 clock cycle includes changing from a low state to a high state.

14. The device of claim 8, wherein the divided output module is further configured to:
    change states on the rising edge of the N+1 clock cycle, where M is even; and change states on the falling edge of the N+1 clock cycle where M is odd.

* * * * *